United States Patent
Jot et al.

(10) Patent No.: US 9,496,850 B2
(45) Date of Patent: Nov. 15, 2016

(54) ALIAS-FREE SUBBAND PROCESSING

(75) Inventors: Jean-Marc Jot, Aptos, CA (US); Martin Walsh, Scotts Valley, CA (US); Jean Laroche, Santa Cruz, CA (US); Mark Phillips, Broomfield, CO (US); Michael Chorn, Longmont, CO (US); Michael M. Goodwin, Scotts Valley, CA (US)

(73) Assignee: Creative Technology Ltd, Singapore (SG)

( * ) Notice: Subject to any disclaimer, the term of this patent is extended or adjusted under 35 U.S.C. 154(b) by 828 days.

(21) Appl. No.: 11/834,608

(22) Filed: Aug. 6, 2007

(65) Prior Publication Data

US 2008/0033730 A1    Feb. 7, 2008

Related U.S. Application Data (60) Provisional application No. 60/821,518, filed on Aug. 4, 2006, provisional application No. 60/821,789, filed on Aug. 8, 2006.

(51) Int. Cl.
| | |
|---|---|
| *G10L 19/00* | (2013.01) |
| *G10L 21/00* | (2013.01) |
| *H03H 17/02* | (2006.01) |
| *G10L 19/02* | (2013.01) |

(52) U.S. Cl.
CPC ....... *H03H 17/0266* (2013.01); *G10L 19/0204* (2013.01); *H04S 2420/01* (2013.01)

(58) Field of Classification Search
USPC ....................................... 704/205, 229, 240
See application file for complete search history.

(56) References Cited

U.S. PATENT DOCUMENTS

| | | | | |
|---|---|---|---|---|
| 4,815,023 A | * | 3/1989 | Arbeiter | 708/301 |
| 4,918,524 A | * | 4/1990 | Ansari et al. | 375/240.11 |
| 5,479,562 A | * | 12/1995 | Fielder | G06T 9/005 |
| | | | | 704/200.1 |
| 5,771,300 A | * | 6/1998 | Daniels | 381/71.5 |
| 5,848,164 A | * | 12/1998 | Levine | 381/61 |
| 5,892,833 A | * | 4/1999 | Maag | H04R 3/04 |
| | | | | 381/103 |
| 6,175,631 B1 | * | 1/2001 | Davis et al. | 381/17 |
| 6,757,396 B1 | * | 6/2004 | Allred | 381/106 |
| 6,868,377 B1 | * | 3/2005 | Laroche | 704/205 |
| 6,961,395 B2 | * | 11/2005 | Fuller et al. | 375/350 |
| 7,177,433 B2 | * | 2/2007 | Sibbald | 381/71.6 |
| 2002/0122562 A1 | * | 9/2002 | Brennan et al. | 381/316 |
| 2004/0240588 A1 | * | 12/2004 | Miller | H04K 1/00 |
| | | | | 375/340 |
| 2007/0100612 A1 | * | 5/2007 | Ekstrand | G10L 19/0208 |
| | | | | 704/220 |

(Continued)

FOREIGN PATENT DOCUMENTS

WO    WO 9856210 A1  *  12/1998

OTHER PUBLICATIONS

Petraglia et al, "Performance analysis of adaptive filter structures based on subband decomposition," Circuits and Systems, 1993., ISCAS '93, 1993 IEEE International Symposium on , vol., No., pp. 60-63 vol. 1, May 3-6, 1993.*

(Continued)

*Primary Examiner* — Olujimi Adesanya
(74) *Attorney, Agent, or Firm* — Russell Swerdon; Desmund Gean (57) ABSTRACT

A digital signal is processed by splitting it into at least two frequency subbands and the two subband signals are downsampled. A filter is applied in at least one of the subband signals. At least one of the phase and magnitude of the subband filtered signals is matched in the transition frequency band between the two subbands.

19 Claims, 5 Drawing Sheets

(56) References Cited

U.S. PATENT DOCUMENTS

2007/0288235 A1* 12/2007 Vaananen et al. ............ 704/229
2007/0299655 A1* 12/2007 Laaksonen et al. .......... 704/205

OTHER PUBLICATIONS

Liu et al, "The design of nonuniform-band maximally decimated filter banks," Circuits and Systems, 1993., ISCAS '93, 1993 IEEE International Symposium on , vol., No., pp. 375-378 vol. 1, May 3-6, 1993.*

Abdellatif Benjelloun Touimi et al,"Efficient method for multiple compressed audio streams spatialization", Proceedings of the 3rd international conference on Mobile and ubiquitous multimedia, p. 229-235, Oct. 27-29, 2004, College Park, Maryland [doi>10.1145/1052380.1052412].*

Sodagar et al, "Time-varying analysis-synthesis systems based on filter banks and post filtering," 1995, In Signal Processing, IEEE Transactions on , vol. 43, No. 11, pp. 2512-2524.*

Avendano et al, "Enhancement of audio signals based on modulation spectrum processing",2004, In Proc. 117th AES Convention, San Francisco, 2004, pp. 1-9.*

Engdegård et al, "Synthetic ambience in parametric stereo coding", 2004, In Proc. 116th AES convention, Berlin, Germany, 2004, pp. 1-12.*

Chen et al, "Design of quadrature mirror filters with linear phase in the frequency domain," 1992, in IEEE Transactions on Circuits and Systems II: Analog and Digital Signal Processing, vol. 39, No. 9, pp. 593-605, Sep. 1992.*

Takebe et al, "A method for designing parallel type pseudo minimum phase FIR QMF banks", 1990, Trans. IEICE, vol. J73-A, pp. 1823-1831.*

* cited by examiner

ALIAS-FREE SUBBAND PROCESSING

CROSS-REFERENCES TO RELATED APPLICATIONS

This application claims priority from provisional U.S. Patent Application Ser. No. 60/821,518, filed Aug. 4, 2006, titled "Alias Free Subband Processing" and provisional U.S. Patent Application Ser. No. 60/821,789, filed Aug. 8, 2006, titled "Alias Free Subband Processing" the disclosures of which are incorporated herein by reference in their entirety.

BACKGROUND OF THE INVENTION

1. Field of the Invention

The present invention relates to signal processing techniques. More particularly, the present invention relates to methods for processing digital signals in subbands and is applicable advantageously to digital audio signals.

2. Description of the Related Art

Subband processing is a well-known technique for lowering the memory requirements and computation cost of audio-processing algorithms. One serious drawback of these techniques is that aliased signal components can appear in the transition band of the filters if two subband signals are processed in different manners. Since the addition of aliased signal components in the processed output is often detrimental to the accuracy or fidelity of the processing, it is desirable to provide an improved subband processing method that minimizes the generation of aliased signal components without requiring that the same processing be applied in each subband.

SUMMARY OF THE INVENTION

The invention describes a technique that can be used to avoid such aliasing.

It is often useful to process digital audio signals in subbands, at reduced sample rates. For example, one might elect to process a lower band (for example, from 0 to 12 kHz) with a given technique, and an upper band (for example, from 12 kHz to 24 kHz) with another simpler one. The advantage may be both in terms of processing cost and in terms of memory requirements, which can be quite important in embedded applications. One problem with this technique is that while it is possible to create efficient filter banks that do not generate undesirable aliasing in the reconstructed signal in the absence of processing, this undesirable aliasing usually appears if different processing is applied to the subband signals.

The invention provides, in various embodiments, methods and devices for processing frequency subband signals without generating aliased components or by generating reduced aliased components. In accordance with one embodiment, a subband matching technique is described.

In accordance with one embodiment, different subband processing filters are applied to a first and second subband signal. The subband processing filters are matched in phase and amplitude in the transition band between the first frequency subband and the second frequency subband. In one variation, the two subband processing filters are linear time invariant filters. In one embodiment, the matching of the subband processing filters is carried out such that the aliased components are as small as possible. In accordance with another embodiment, the aliased components are maintained below a predetermined threshold.

In accordance with another embodiment, a method of efficiently processing a digital signal is provided. The digital signal is split into at least two frequency subbands to generate at least two subband signals, e.g., a first and second subband signal. The subband signals are downsampled or decimated, generating first and second downsampled signals. A transition frequency band between the at least two frequency subbands is determined. At least one subband processing filter is applied to at least one of the downsampled subband signals to generate processed subband signals, which are then combined to reconstruct an output signal. The subband signals are substantially matched in at least one of amplitude and phase in order to reduce the generation of aliased components in the output signal. At least one of the downsampled subband signals is processed by a subband processing filter. Others of the downsampled subband signals in this embodiment may be processed by less complex processing means, by passing the signal through unchanged, or by any of a variety of subband processing filters.

In other embodiments, the processed subband signals are generated by applying subband processing filters to a plurality of downsampled subband signals and yet in other embodiments all of the downsampled subband signals are processed by subband processing filters.

In accordance with yet another embodiment, a method of processing a signal further includes receiving a second digital signal and splitting the second digital signal into the first and second frequency subbands to generate a third and a fourth subband signal, respectively. Third and fourth downsampled subband signals are generated by downsampling or decimating the third and fourth subband signals. The subband processing filter combines or is applied to a combination of the first and third downsampled subband signals.

By using the inventive techniques, the need for using much sharper subband analysis filters with narrower transition bands is reduced or eliminated. Further, using the inventive technique avoids the higher computation costs, and potentially additional (undesirable) group delay in the transition band required by known alternatives.

These and other features and advantages of the present invention are described below with reference to the drawings.

DETAILED DESCRIPTION OF PREFERRED EMBODIMENTS

Reference will now be made in detail to preferred embodiments of the invention. Examples of the preferred embodiments are illustrated in the accompanying drawings. While the invention will be described in conjunction with these preferred embodiments, it will be understood that it is not intended to limit the invention to such preferred embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known mechanisms have not been described in detail in order not to unnecessarily obscure the present invention.

It should be noted herein that throughout the various drawings like numerals refer to like parts. The various drawings illustrated and described herein are used to illustrate various features of the invention. To the extent that a particular feature is illustrated in one drawing and not another, except where otherwise indicated or where the structure inherently prohibits incorporation of the feature, it is to be understood that those features may be adapted to be included in the embodiments represented in the other figures, as if they were fully illustrated in those figures. Unless otherwise indicated, the drawings are not necessarily to scale. Any dimensions provided on the drawings are not intended to be limiting as to the scope of the invention but merely illustrative.

Figure 3:
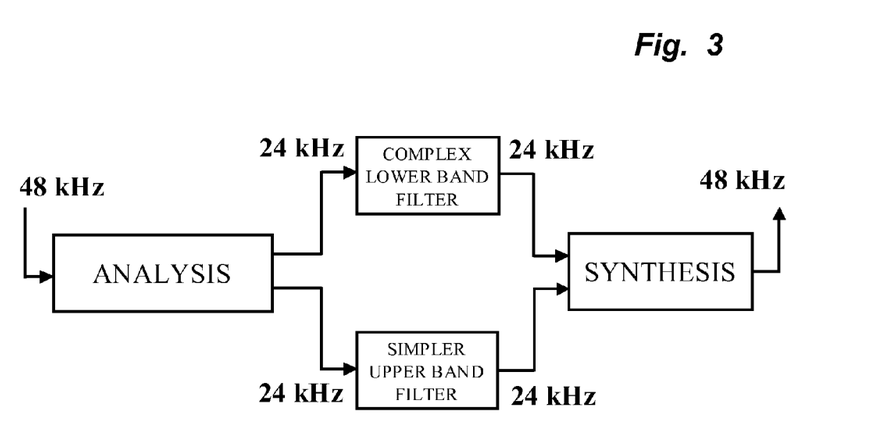
FIG. 3 is a diagram illustrating the subband processing of a digital signal using a low-complexity upper-band processing filter in accordance with one embodiment of the present invention.

When processing digital audio signals in two subbands, two different subband processing filtering algorithms are usually applied on the two subband signals. For example, a full-fledged equalizer filter will be applied in the lower band (for example, from 0 to 12 kHz) and a much simpler filter will be applied in the upper band (for example, from 12 kHz to 24 kHz) where the exact characteristics of the subband processing filter are not as important, as illustrated in FIG. 3. FIG. 3 is a diagram generally illustrating the subband processing of a signal using a low-complexity upper-band processing filter in accordance with one embodiment of the present invention. The low-complexity processing filter may have, for example, lower computational complexity than the lower-band filter; it may even be a unity gain filter or, in some cases, a zero gain.

This technique allows considerable computation and memory savings, but care must be taken to not introduce aliased signal components in the transition band (i.e., around 12 kHz in the example above). Well known subband analysis and synthesis filter bank designs exist that can reconstruct a signal from its subbands without introducing aliasing (so-called alias-free filter banks) under the assumption that the two subband signals undergo exactly the same linear time-invariant subband processing filters. If this is not the case (as in the example above) then the alias-free filter banks no longer guarantee that no aliased signal components are found in the transition band.

Figure 4A:
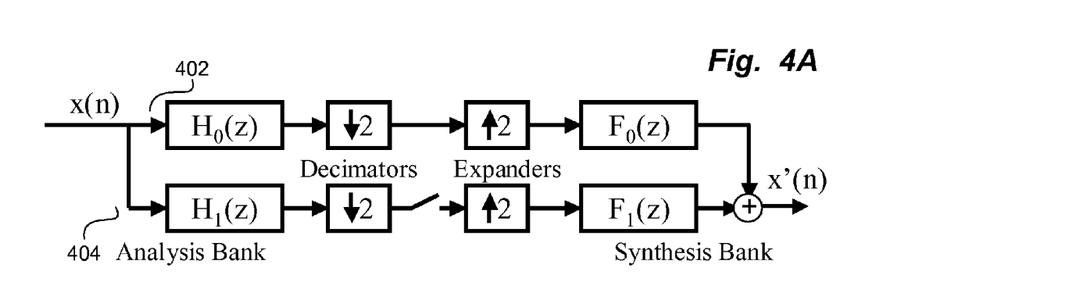
FIG. 4 is a diagram illustrating the cancellation of undesired aliased signal components in the subband processing of a digital signal in accordance with one embodiment of the present invention.
Figure 4B:
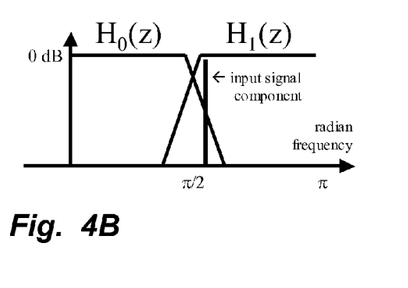
Figure 4C:
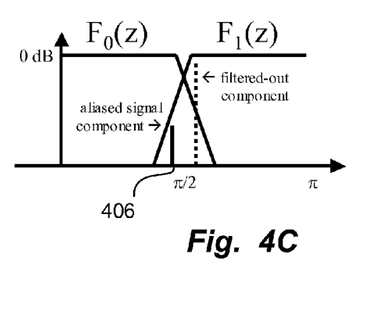

FIG. 4 illustrates this phenomenon in the particular case where the lower band signal 402 is passed through while the upper band 404 is silenced: an undesired aliased signal component 406 appears in the reconstructed output signal. Such aliased components are cancelled out by the synthesis filter bank if the upper band signal is also transmitted and the analysis/synthesis filters satisfy, for instance, the relation:

$$F_0(z)=H_1(-z) \text{ and } F_1(z)=-H_0(-z).$$

Figure 5:
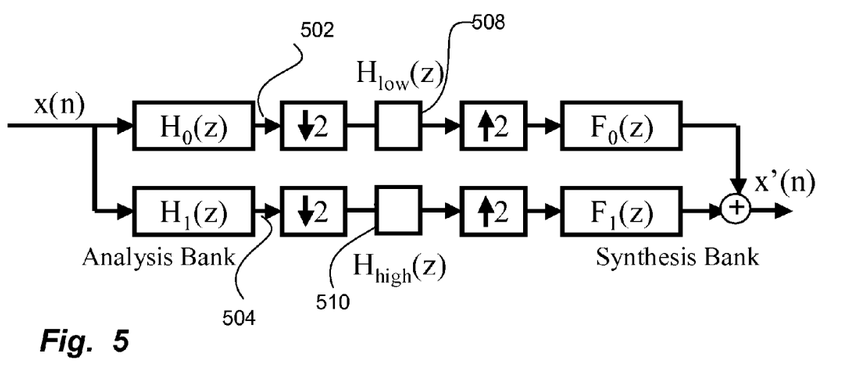
FIG. 5 is a diagram illustrating the subband processing of a digital signal using different subband processing filters in accordance with one embodiment of the present invention.

FIG. 5 shows the case where the lower-band and upper-band down-sampled signals 502, 504 are processed by a lower-band processing filter $H_{low}(z)$ 508 and an upper-band processing filter $H_{high}(z)$ 510, respectively. In this case, it can be shown that aliased components will be cancelled in the reconstructed output signal if the processing filters $H_{low}$ and $H_{high}$ are identical. However, as mentioned above, it is desirable to provide an improved subband processing method allowing for the use of different subband processing filters while avoiding or reducing aliased components in the output signal.

Method embodiments described herein allow us to apply different subband processing filters to each subband signal, while ensuring that aliased components are as small as possible. This is a significant improvement because aliased components can be very objectionable, depending on their frequency and amplitude.

The two subband processing filters applied in the lower and upper bands are selected to match in phase and amplitude in the transition band. Denoting the subband processing filters applied to the low-frequency and high-frequency subband signals by $H_{low}(f)$ and $H_{high}(f)$ respectively, this objective is summarized by the relationships:

$$|H_{low}(f_1)| \approx |H_{high}(f_2)| \text{ and } \angle H_{low}(f_1) \approx \angle H_{high}(f_2)$$

where $|H_{low}(f_1)|$ denotes the magnitude of the filter $H_{low}$ at frequency $f_1$, and $\angle H_{low}(f_1)$ denotes its phase at frequency $f_1$. The frequency $f_1$ corresponds to the top of the low-frequency subband (i.e., near the Nyquist frequency for this subband) and the frequency $f_2$ corresponds to the bottom of the high-frequency subband (i.e., near DC for this subband).

Figure 7:
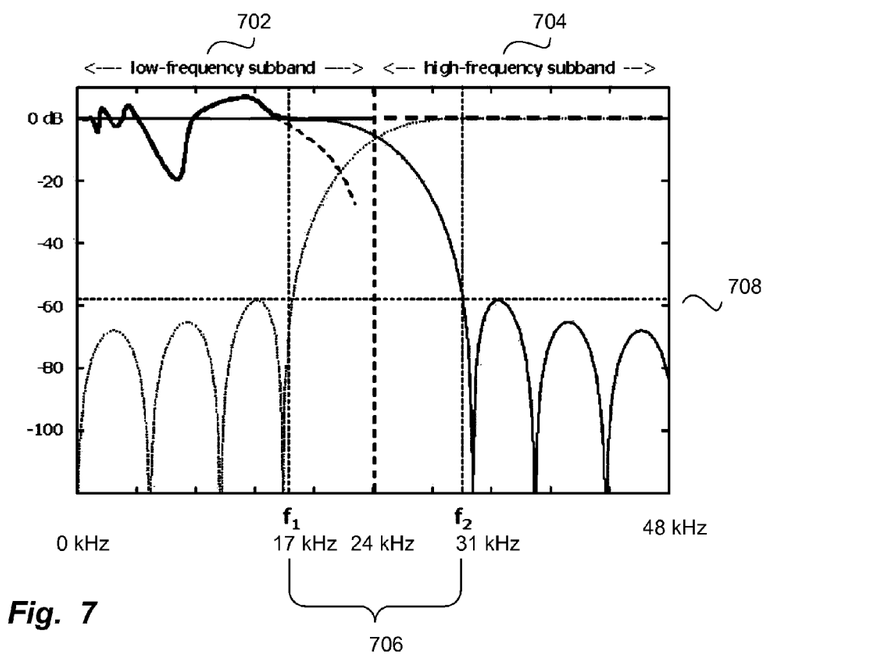
FIG. 7 is a diagram illustrating the subband processing of a digital signal using different subband processing filters in accordance with one embodiment of the present invention.

If these two conditions are met exactly then no aliasing will occur. If they are met approximately, some amount of aliasing will occur, the exact magnitude of which will depend on how closely the conditions are met. Accordingly, in one embodiment, the at least one subband processing filter is selected to minimize both the mismatch of the phase and amplitude in the transition band. In other words, the one or more subband processing filters are preferably selected to optimize the matching of their phase and amplitude responses over the transition frequency band. An example of a transition frequency band is illustrated in FIG. 7, described in further detail below. In another embodiment, selection and/or design of the one or more subband processing filters involves ensuring that the phase and amplitude matching in the transition band is sufficient to keep the magnitude of aliased signal components below a predetermined threshold. In one embodiment, both phase and amplitude matching are optimized.

Figure 1A:
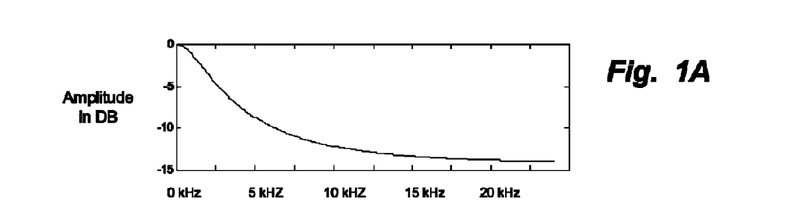
FIGS. 1A, 1B are diagrams illustrating respectively the magnitude and phase behavior of a high-shelving filter implementation in accordance with one embodiment of the present invention.
Figure 1B:
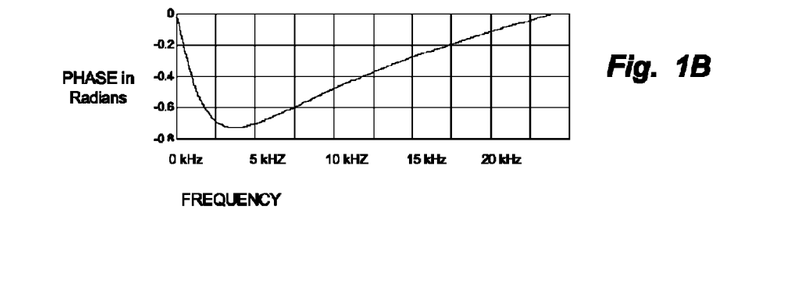

Designing the subband processing filters $H_{low}$ and $H_{high}$ to meet these constraints depends on the type of filters to be implemented. The methods and devices of the present invention may be implemented without limitation with a variety of filters. For example, in implementing a high shelving filter in subbands, one could chose a minimum phase implementation in the low-frequency subband, to ensure that the phase at the transition band (i.e. at the Nyquist frequency of the low-frequency subband signal) returns to 0. Because this minimizes the group delay, it can help match the phases between the two subband processing filters in the transition band. For a non-limiting example, the Regalia-Mitra shelving filter topology could be used. FIG. 1 shows the magnitude and phase behavior of such a filter.

Figure 2:
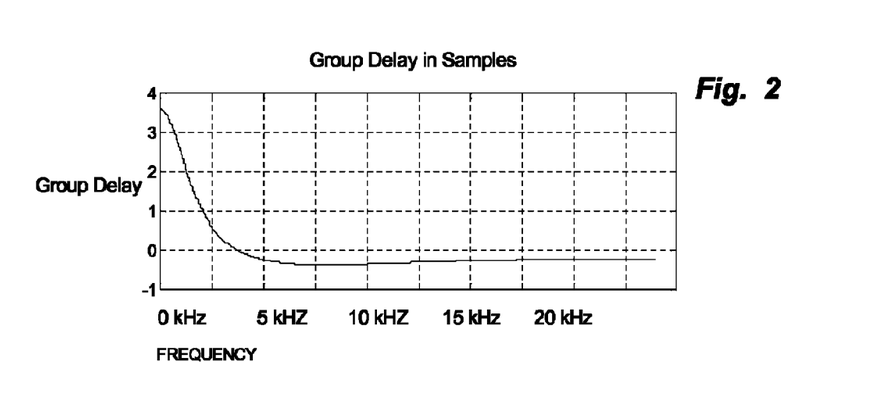
FIG. 2 is a diagram illustrating the measured group delay of the shelving filter in the low-frequency subband in accordance with one embodiment of the present invention.

In the high-frequency subband, one could insert a simple gain that would match the gain of the low-frequency subband processing filter measured at its Nyquist frequency (−14 dB in the example above), but this would not match the phase very well (because the phase would be 0, while the low-frequency subband phase is not exactly 0 near the Nyquist frequency, as seen in FIG. 1B). Ideally, one would use an additional delay in the high-frequency subband that matches the delay measured around the Nyquist frequency in the low-frequency subband. FIG. 2 shows the measured group delay of the shelving filter in the low-frequency subband. The group delay is proportional to the derivative of the phase (see FIG. 1B) with respect to frequency.

In order to match gain and phase in the example shown in FIG. 1, the processing filter in the high-frequency subband could be designed, for a non-limiting example, to have a gain of −14 dB and a group delay near DC of about −0.25 samples (or a group delay of 0.25 samples could be inserted in the low-frequency subband as an alternative). This would guarantee that the phases of the two subband processing filters approximately match in the transition band, thereby minimizing the amount of aliasing.

In yet another embodiment, illustrated in FIG. 7, the method is used with a subband processing filter modeling a Head-Related Transfer Function (HRTF). In this embodiment, the HRTF filter is applied to the low-frequency subband, while a compensating filter (preferably of low complexity) is used in the high-frequency subband. The HRTF filter is preferably designed to have a flat magnitude response around the Nyquist frequency (the transition band in the original sampling rate), along with a maximally flat phase response (small group delay). The high-frequency subband processing filter only needs to include a gain to match the amplitude of the HRTF filter at the Nyquist frequency, and, if necessary, implement a group delay at DC approximately equal to the group delay of the HRTF filter measured around the Nyquist frequency.

Various examples of subband processing filters have been described for illustrative purposes. It should be understood that the techniques and devices described herein are not intended to be limited to these examples. It should be understood that the scope of the invention includes any type of filter applied to the respective subbands, including but not limited to an equalization filter, a low-shelving filter, a high shelving filter, a filter modeling a head related transfer function (HRTF), a dynamic range compressor, a reverberator, a linear time invariant (LTI) filter, a frequency-domain filter, a non-linear filter, and a linear but time-variant filter. In yet other embodiments, the subband processing filters involve a cascade or plurality of filters. That is, each subband may be processed by a plurality of subband processing filters associated in series or in parallel with matching of amplitude and phase frequency response in the transition band preferably occurring for each one of the plurality of the subband processing filters or overall for their cascade combination.

In the example illustrated in FIG. 7, an HRTF filter, applied in the low-frequency subband 702, is modeled to approximate a measured HRTF up to frequency $f_1$ but have a flat amplitude frequency response at 0 dB in the transition frequency band 706 (from $f_1$ up to the Nyquist frequency at 24 kHz). Therefore, in the embodiment illustrated in this example, one suitable high-frequency subband processing filter for alias-free subband processing would have a frequency independent amplitude response of 0 dB. The subband analysis and synthesis filters are designed such that the sidelobes in their frequency response remain below a threshold approximately equal to −60 dB. Determining the transition frequency band between the two frequency subbands impacts the phase and amplitude matching. In this example, the frequencies $f_1$ and $f_2$ are chosen such that, if the phase and amplitude responses of the subband processing filters are closely matched in the transition frequency band 706, aliased components cannot exceed a predetermined level 708 (approximately −60 dB in this example). If the phase response of the HRTF filter is close enough to 0 in the transition frequency band, the high-frequency subband processing filter is not necessary in this example. Otherwise, a suitable high-frequency subband processing filter may be an all-pass filter designed to achieve more accurate phase matching in the transition frequency band.

In other embodiments, the situation is more favorable, for example when implementing a filter modeling a contralateral HRTF which has a low-pass characteristic. In this case, it is easy to constrain the modeled HRTF filter to have a very small gain (e.g., −60 dB) in the transition frequency band so that the high-frequency subband signal can simply be zeroed-out without introducing any audible aliasing artifacts.

Figure 6:
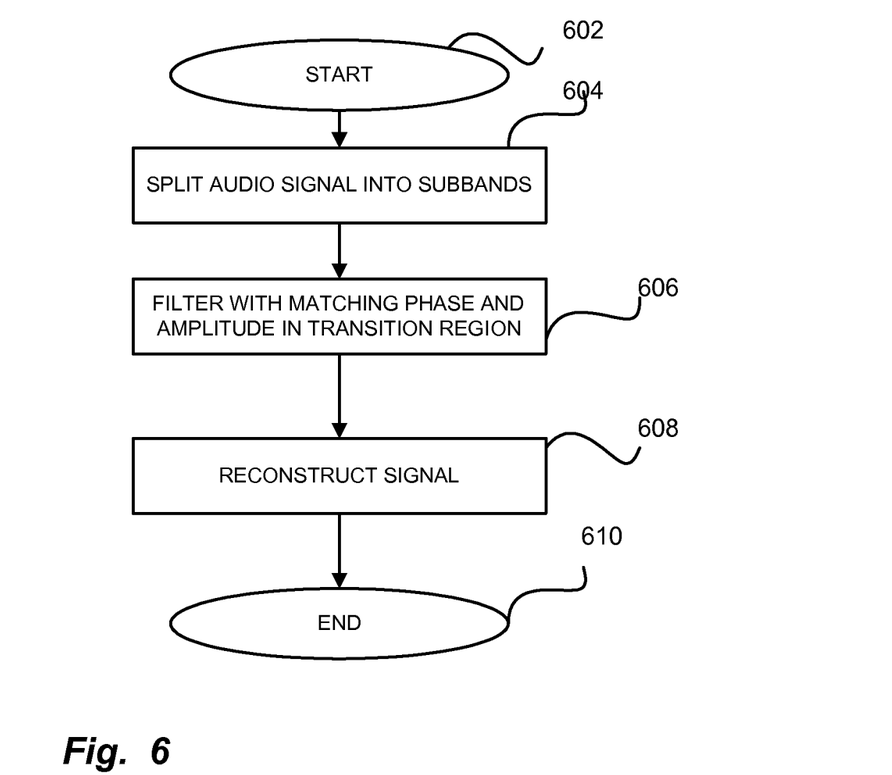
FIG. 6 is a flowchart illustrating a method of processing a digital signal in accordance with one embodiment of the present invention.

FIG. 6 is a flowchart illustrating a method of processing an audio signal in accordance with one embodiment of the present invention. The process commences at operation 602. Next, at operation 604 the incoming audio signal is split into at least two subbands, for example using low pass filters, high pass filters, low-high shelving filters, bandpass filters, etc. For illustration purposes, the signal will be described as split into a low-frequency subband and a high-frequency subband. However, this is not intended to be limiting. The scope of the invention extends also without limitation to three or more subband signals generated by splitting an incoming signal. Methods of splitting an incoming audio signal into different frequency subbands are known to those of skill in the relevant arts and hence complete details will not be provided herein. In cases of three or more subbands, after the transition frequency bands are determined between respective frequency subbands, the subband processing may be selected such that suitable (i.e., to meet the selected matching criteria) matching in phase and amplitude occurs for each transition band. For example, for four frequency subbands, there will be three transition bands. For three subbands there will be two transition bands.

Next, at operation 606, subband processing filters are applied to the respective subband signals, these filters being specified and implemented in such a way that matching of phase and amplitude in the transition frequency band occurs. That is, for example, the phase response of the low-frequency subband processing filter at the top frequency of the low frequency subband ($f_1$) is substantially matched to the phase response of the high-frequency subband processing filter at the bottom frequency ($f_2$) of the high-frequency subband, where the transition band lies approximately between frequencies $f_1$ and $f_2$. In similar fashion, the amplitude response of the subband processing filters at and between the respective frequencies $f_1$ and $f_2$ is matched. Preferably, complete matching is achieved in both phase and frequency response and no aliasing occurs. In alternative embodiments, the matching is accomplished by selecting respective subband processing filters that generate an acceptable level of aliasing, the magnitude of the aliased signal components being a function of the matching of the phase and amplitude in the transition band. Matching preferably occurs through the design of the subband processing filters operating respectively on the subband signals. For example, a subband processing filter selected for the high-frequency subband preferably has a gain matched to the low-frequency subband's Nyquist frequency gain. Phase matching can be accomplished by designing the high-frequency subband processing filter with a suitable group delay to match the low-frequency subband's group delay at the Nyquist frequency.

In operation 608 the output signal is reconstructed by combining the processed subband signals and exhibits preferably minimal or no aliasing. The method ends at operation 610.

In one embodiment, a multi-rate digital signal processing technique called quadrature mirror filtering is implemented. Quadrature mirror filter (QMF) banks allow us to separate the upper half of the frequency band from the lower half and recombine them at a later stage. In this embodiment, the incoming audio signal is split and down-sampled into at least two frequency bands, one of which represents the original signal down-sampled and low-pass filtered, for example at a 48 kHz sampling rate. The lower band is then processed with any of a plurality of subband processing audio effects with the low-frequency subband processing matched to the high-frequency subband signal in the transition band. The low-frequency subband processed signal is then combined with the high-frequency subband signal to restore full signal bandwidth Note that matching the high-frequency subband signals should not require full processing equivalent to the subband processing applied in the low-frequency subband. Here, corrections may be made to the high-frequency subband signals such that they match the gain and delay applied in the low-frequency subband at and near the crossover frequency (e.g. 24 kHz). Compensations may be required for algorithms such as volume scaling, spatialization, and equalization. Preferably, the design of the subband processing filter implemented in the low-frequency subband is selected such that the matching of phase and amplitude in the high-frequency subband signal can be accomplished without requiring complexity in the subband processing filter applied to the high-frequency subband signal. In yet another embodiment, the subband processing of the high-frequency subband signal involves setting a uniform gain or other low-complexity filtering function.

Undesirable side effects such as amplitude distortion, phase distortion and aliasing may result from mismatching the low-frequency and high-frequency subband processing filters. Hence, it is necessary to design these subband processing filters such that matching of phase and amplitude is achieved in the transition frequency band.

The techniques described are not limited to single input, single output systems. For example, a plurality of input signals may be processed and mixed. In one embodiment, the plurality of input signals are used to generate a plurality of low-frequency subband signals. Corresponding high-frequency subband signals are also derived. The low-frequency subband signals are then subjected to multi-channel processing and mixing. The high-frequency subband signals are subjected to multi-channel processing matching the low-frequency subband multi-channel processing over the transition frequency band. The multi-channel processing may include, in one non-limiting example, 3-D audio virtualization through the use of filters modeling HRTF's.

Figure 8:
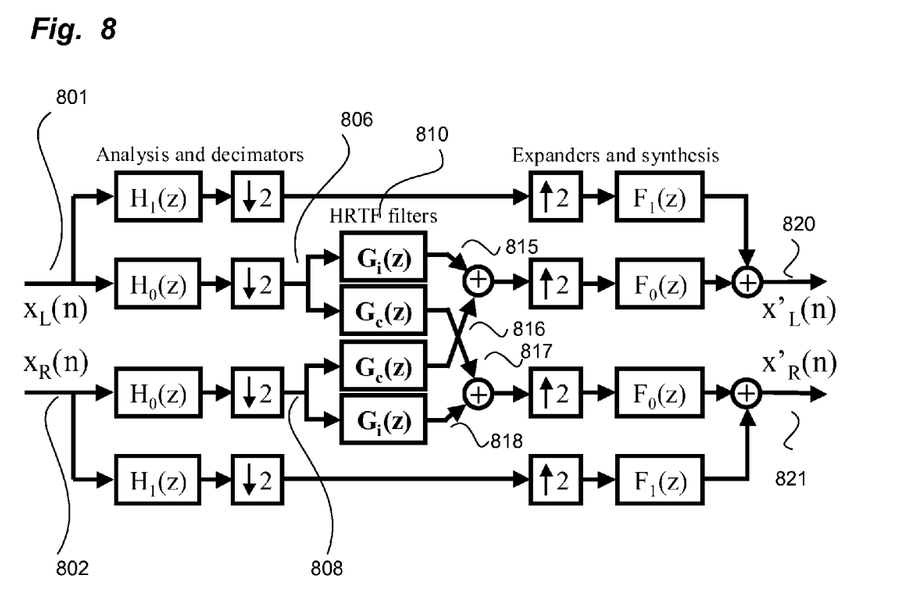
FIG. 8 is a diagram illustrating 3-D audio virtualization processing of a two-channel signal in accordance with one embodiment of the present invention.

FIG. 8 is a diagram illustrating the 3-D audio virtualization processing of a two-channel signal in accordance with one embodiment of the present invention. As illustrated in FIG. 8, each channel of the stereo signal 801, 802 may be split into a low-frequency subband and a high-frequency subband. In order to reduce computation, the high-frequency subband signals 805, 807 are preferably passed without processing, or, alternatively, processed by a low complexity subband processing filter. The low-frequency subbands 806, 808 are directed to HRTF filters 810. Thus, for example, the low-frequency subband for the left channel is processed by an ipsilateral HRTF ($G_i(z)$) and a contralateral HRTF ($G_c(z)$). The same type of processing (i.e., separate ipsilateral and contralateral HRTF filtering) is applied to the right channel's low-frequency subband signal and, preferably, the left channel virtualized signal 820 is generated from a combination of the ipsilateral HRTF filtered left-channel low-frequency subband signal 815 and the contralateral HRTF filtered right-channel low-frequency subband signal 816. Similarly, the right channel virtualized signal is formed at least in part from the combination of the HRTF filtered low-frequency subband signals 817 and 818.

The invention has been described for illustration purposes in its application to digital signals. However, the scope of the invention is not so limited. The techniques described may also be used to process analog signals. For example, an analog signal may be split into at least a first and a second frequency subbands above and below a transition frequency to generate at least a first and a second subband signal. The first and second downsampled subband signals may be generated by sampling the first and second subband signals at a sample rate equal to twice the transition frequency. A transition frequency band between the first and second frequency subbands is determined. First and second processed subband signals are then generated by applying at least one subband processing filter to at least one of the first and second downsampled subband signals. The first and second processed subband signals are then combined to reconstruct an output signal. By judicious determination of the transition band and selection of the filtering or other processing, the processed subband signals are substantially matched in at least one of amplitude and phase in the transition frequency band in order to reduce the generation of aliased components in the output signal.

As with the embodiments of efficiently processing a digital signal as described above, the subband processing applied to the first downsampled subband signal in one embodiment is of substantially lower complexity than the processing applied to the second downsampled subband signal. The analog signal may be an audio signal. In one embodiment, matching occurs in both amplitude and phase. The analog signal may be processed such that the subband processing occurs in more than one subband and the frequency responses of the subband processing filters are matched in at least one of amplitude and phase in the transition frequency band, in order to reduce the generation of aliased components in the output signal.

The subband processing filter may be of any suitable type including but not limited to an equalization filter, a low-shelving filter, a filter modeling a head related transfer function (HRTF), a dynamic range compressor, a reverberator, a linear time invariant filter (LTI), a frequency domain filter, a non-linear filter and a linear but time variant filter. Further, the subband processing filter may in certain embodiments comprise a cascade of filters.

It should be noted that the description herein and diagrams generally refer to an expansion or upsampling before subband signals are recombined. It should be understood that the embodiments of the present invention are not so limited. For example, in some embodiments, the expansion is incorporated into the combining step. Likewise, the invention embodiments are not limited to splitting the incoming signal before decimation (or downsampling) but include in certain embodiments combining decimation (or downsampling) with splitting in one step (or filter bank).

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of processing a first digital signal and a second digital signal, the method comprising:
    splitting the first digital signal into a first and a second frequency subbands to generate a first and a second subband signal, the first frequency subband corresponding to a high-frequency subband, the second frequency subband corresponding to a low-frequency subband;
    splitting the second digital signal into the first and second frequency subbands to generate a third and a fourth subband signal, the third frequency subband corresponding to the high-frequency subband, the fourth frequency subband corresponding to the low-frequency subband;
    generating first and second downsampled subband signals by downsampling or decimating the first and second subband signals;
    generating third and fourth downsampled subband signals by downsampling or decimating the third and fourth subband signals;
    determining a transition frequency band between the first and second frequency subbands;
    generating first and second processed subband signals by applying a low-complexity subband processing filter to the first downsampled subband signal and a high-complexity subband processing filter to the second downsampled subband signal;
    generating third and fourth processed subband signals by applying at least one subband processing filter to at least one of the third and fourth downsampled subband signals;
    combining the first and second processed subband signals to reconstruct a first output signal; and
    combining the third and fourth processed subband signals to reconstruct a second output signal,
    wherein the subband processing filters are substantially matched in amplitude and phase in order to reduce the generation of aliased components in corresponding output signals, wherein the design of the high-complexity subband processing filter applied to the low-frequency subband signal is selected such that the matching of phase and amplitude in the high-frequency subband signal can be accomplished in conjunction with the low-complexity subband processing filter applied to the high-frequency subband signal, thereby optimizing both phase and amplitude matching while ensuring that the matching in the transition band is sufficient to keep the magnitude of aliased components below a predetermined threshold;
    and
    wherein the subband processing filters are applied to a combination of the first and third downsampled subband signals.

2. The method as recited in claim 1 wherein the combining the processed subband signals includes expanding or upsampling the processed subband signals to an ouput sample rate.

3. The method as recited in claim 1 wherein the splitting and downsampling or decimating are performed simultaneously in an analysis filter bank.

4. The method as recited in claim 1 wherein the subband processing applied to the third downsampled subband signal is of substantially lower complexity than the subband processing applied to the fourth downsampled subband signal.

5. The method as recited in claim 1 wherein the first digital signal is first channel of an audio stereo signal and the second digital signal is a second channel of the audio stereo signal.

6. The method as recited in claim 1 wherein the subband processing occurs in more than one subband.

7. The method as recited in claim 1 wherein the subband processing filters are selected from the group consisting of: an equalization filter, a low-shelving filter, a filter modeling a head related transfer function (HRTF), a dynamic range compressor, a reverberator, a linear time invariant filter (LTI), a frequency domain filter, a non-linear filter and a linear but time variant filter.

8. The method as recited in claim 1 wherein the subband processing filter comprises a cascade of filters.

9. The method as recited in claim 8 wherein the cascade of filters is applied to at least two downsampled subband signals.

10. The method as recited in claim 1 wherein the subband processing filter is implemented using a frequency-domain processing method.

11. The method as recited in claim 1 wherein the matching is performed at least in part by using a compensation filter in the high-frequency subband.

12. The method as recited in claim 11 wherein an HRTF modeling filter is applied in the low-frequency subband.

13. The method as recited in claim 1 wherein the method is implemented in a quadrature mirror filter (QMF) bank.

14. The method as recited in claim 1, wherein the substantially matched amplitude is achieved by implementing a gain in only one of the first and second downsampled subband signals, and wherein the substantially matched phase is achieved by implementing a delay in only one of the first and second downsampled subband signals.

15. The method as recited in claim 14, wherein the gain and the delay are both implemented in either the first or second downsampled subband signals.

16. The method as recited in claim 14, wherein the delay and gain are both designed into one of the subband processing filters.

17. The method as recited in claim 1, wherein the matching is performed at least in part by using a compensation filter in the high-frequency subband.

18. A device configured to
    split a first signal into at least two frequency subbands to generate at least a first and a second subband signal, the first frequency subband corresponding to a high-frequency subband, the second frequency subband corresponding to a low-frequency subband;

split a second signal into the at least two frequency subbands to generate at least a third and a fourth subband signal, the third frequency subband corresponding to the high-frequency subband, the fourth frequency subband corresponding to the low-frequency subband;

generate first and second downsampled subband signals by downsampling or decimating the first and second subband signals;

generate third and fourth downsampled subband signals by downsampling or decimating the third and fourth subband signals;

determine a transition frequency band between the at least two frequency subbands;

generate first and second processed subband signals by applying a low-complexity subband processing filter to the first downsampled subband signal and a high-complexity subband processing filter to the second downsampled subband signal;

generate third and fourth processed subband signals by applying at least one subband processing filter to at least one of the third and fourth downsampled subband signals;

combine the first and second processed subband signals to reconstruct a first output signal; and combine the third and fourth processed subband signals to reconstruct a second output signal, wherein the subband processing filters are substantially matched in amplitude and phase in order to reduce the generation of aliased components in corresponding output signals, wherein the design of the high-complexity subband processing filter applied to the low-frequency subband signal is selected such that the matching of phase and amplitude in the high-frequency subband signal can be accomplished in conjunction with the low-complexity subband processing filter applied to the high-frequency subband signal, thereby optimizing both phase and amplitude matching while ensuring that the matching in the transition band is sufficient to keep the magnitude of aliased components below a predetermined threshold; and wherein the subband processing filters are applied to a combination of the first and third downsampled subband signals.

19. A method comprising:

splitting a first signal into at least a first and a second frequency subbands above and below a transition frequency to generate at least a first and a second subband signal, the first frequency subband corresponding to a high-frequency subband, the second frequency subband corresponding to a low-frequency subband;

splitting a second signal into at least the first and the second frequency subbands above and below the transition frequency to generate at least a third and a fourth subband signal, the third frequency subband corresponding to the high-frequency subband, the fourth frequency subband corresponding to the low-frequency subband;

generating first and second downsampled subband signals by downsampling or decimating the first and second subband signals;

generating third and fourth downsampled subband signals by downsampling or decimating the third and fourth subband signals;

determining a transition frequency band between the first and second frequency subbands;

generating first and second processed subband signals by applying a low-complexity subband processing filter to the first downsampled subband signal and a high-complexity subband processing filter to the second downsampled subband signal;

generating third and fourth processed subband signals by applying at least one subband processing filter to at least one of the third and fourth downsampled subband signals;

combining the first and second processed subband signals to reconstruct a first output signal; and combining the third and fourth processed subband signals to reconstruct a second output signal, wherein the subband processing filters are substantially matched in amplitude and phase in order to reduce the generation of aliased components in corresponding output signals, wherein the design of the high-complexity subband processing filter applied to the low-frequency subband signal is selected such that the matching of phase and amplitude in the high-frequency subband signal can be accomplished in conjunction with the low-complexity subband processing filter applied to the high-frequency subband signal, thereby optimizing both phase and amplitude matching while ensuring that the matching in the transition band is sufficient to keep the magnitude of aliased components below a predetermined threshold;

and wherein the subband processing filters are applied to a combination of the first and third downsampled subband signals.

* * * * *